United States Patent
Ishihara et al.

(10) Patent No.: US 11,903,168 B2
(45) Date of Patent: Feb. 13, 2024

(54) HEAT DISSIPATION MEMBER

(71) Applicant: DENKA COMPANY LIMITED, Tokyo (JP)

(72) Inventors: Yosuke Ishihara, Omuta (JP); Daisuke Goto, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 433 days.

(21) Appl. No.: 17/298,169

(22) PCT Filed: Nov. 19, 2019

(86) PCT No.: PCT/JP2019/045208
§ 371 (c)(1),
(2) Date: May 28, 2021

(87) PCT Pub. No.: WO2020/110824
PCT Pub. Date: Jun. 4, 2020

(65) Prior Publication Data
US 2022/0124936 A1    Apr. 21, 2022

(30) Foreign Application Priority Data
Nov. 29, 2018    (JP) .................................. 2018-223830

(51) Int. Cl.
*H05K 7/20*    (2006.01)
(52) U.S. Cl.
CPC ....... *H05K 7/2039* (2013.01); *H05K 7/20854* (2013.01)
(58) Field of Classification Search
CPC .............. H05K 7/2039; H05K 7/20854; F28D 2021/0028; H01L 23/40
(Continued)

(56) References Cited

U.S. PATENT DOCUMENTS 6,447,894 B1    9/2002    Hirotsuru et al.
7,993,728 B2    8/2011    Hirotsuru et al.
(Continued)

FOREIGN PATENT DOCUMENTS

EP    2 447 990 A1    5/2012
JP    2002-299532 A    10/2002
(Continued)

OTHER PUBLICATIONS

Mar. 13, 2023 Office Action issued in Taiwanese Patent Application No. 108142422.
(Continued)

*Primary Examiner* — Justin M Jonaitis
(74) *Attorney, Agent, or Firm* — Oliff PLC

(57) ABSTRACT

A substantially rectangular flat heat dissipation member includes: a composite portion where silicon carbide having voids is impregnated with metal; and a metal portion that is different from the composite portion. Here, a proportion of a volume of the metal portion to a total volume of the heat dissipation member is 2.9% or higher and 12% or lower. In addition, when a length of a diagonal line of the rectangular flat heat dissipation member is represented by L, in a top view where one main surface of the heat dissipation member is a top surface, 40% or higher of a total volume of the metal portion is present in a region D within a distance of L/6 from an apex of any one of four corners of the heat dissipation member. Further, a hole penetrates the metal portion in the region D.

10 Claims, 11 Drawing Sheets

(58) Field of Classification Search
USPC ........................................................ 165/80.2
See application file for complete search history.

(56) References Cited

U.S. PATENT DOCUMENTS

| | | | |
|---|---|---|---|
| 8,025,962 B2 | 9/2011 | Hirotsuru et al. | |
| 8,897,015 B2 | 11/2014 | Feller et al. | |
| 9,556,501 B2 | 1/2017 | Iwayama et al. | |
| 10,233,125 B2 | 3/2019 | Goto et al. | |
| 10,869,413 B2* | 12/2020 | Miyakawa | C22C 47/06 |
| 2009/0092793 A1 | 4/2009 | Hirotsuru et al. | |
| 2009/0280351 A1 | 11/2009 | Hirotsuru et al. | |
| 2012/0106087 A1 | 5/2012 | Feller et al. | |
| 2012/0305632 A1 | 12/2012 | Ross et al. | |
| 2013/0009301 A1 | 1/2013 | Iwayama et al. | |
| 2014/0183733 A1 | 7/2014 | Chu et al. | |
| 2016/0013115 A1 | 1/2016 | Vadhavkar et al. | |
| 2017/0107158 A1* | 4/2017 | Goto | C22C 1/1073 |
| 2017/0142859 A1 | 5/2017 | Miyakawa et al. | |
| 2018/0281230 A1* | 10/2018 | Ota | C22C 26/00 |
| 2019/0093201 A1* | 3/2019 | Ishihara | C22C 21/02 |
| 2021/0261737 A1* | 8/2021 | Kudoh | H01L 23/3737 |
| 2022/0018617 A1* | 1/2022 | Kudoh | B29C 70/88 |
| 2022/0104400 A1* | 3/2022 | Goto | F28F 21/02 |

FOREIGN PATENT DOCUMENTS

| | | |
|---|---|---|
| JP | 2003-204022 A | 7/2003 |
| JP | 3468358 B2 | 11/2003 |
| JP | 3662221 B2 | 6/2005 |
| JP | 2014-181372 A | 9/2014 |
| TW | 201216382 A | 4/2012 |
| TW | 201314803 A | 4/2013 |
| TW | 201428865 A | 7/2014 |
| TW | 201606956 A | 2/2016 |
| TW | 201629148 A | 8/2016 |
| WO | 2007/080701 A1 | 7/2007 |
| WO | 2007/125878 A1 | 11/2007 |
| WO | 2011/125441 A1 | 10/2011 |
| WO | 2015/141729 A1 | 9/2015 |
| WO | 2016/002943 A1 | 1/2016 |

OTHER PUBLICATIONS

Feb. 18, 2020 International Search Report issued in International Patent Application No. PCT/JP2019/045208.

* cited by examiner (a)

(b)

(a)

(b)

(a)

(b)

HEAT DISSIPATION MEMBER

TECHNICAL FIELD

The present invention relates to a heat dissipation member. More specifically, the present invention relates to a heat dissipation member that is substantially rectangular flat.

BACKGROUND ART

Recently, as a heat dissipation component for a power module in an electric vehicle or an electric railway, a metal-silicon carbide composite has been used instead of copper in the related art.

A thermal conductivity of the metal-silicon carbide composite is not equivalent to that of copper. However, a thermal expansion coefficient of the metal-silicon carbide composite is 6 to 10 ppm/K, which is about half of 17 ppm/K as the thermal expansion coefficient of copper. Accordingly, the occurrence of cracking in a solder layer portion that bonds a ceramic circuit substrate and a heat dissipation plate forming a module to each other is likely to be suppressed, and high reliability tends to be obtained.

As the metal of the metal-silicon carbide composite, aluminum is used frequently.

For example, as described in Patent Document 1, an aluminum-silicon carbide composite can be prepared through the following steps including: (1) mixing additives or the like with silicon carbide powder; (2) forming a compact using a dry press method, an extrusion method, or an injection method; (3) calcinating this compact to prepare a porous compact (preform) containing silicon carbide as a main component; and (4) impregnating the preform with metal containing aluminum using a non-pressurized impregnation method or a pressurized impregnation method such as squeeze casting or die casting.

The metal-silicon carbide composite may be plated after being surface-treated or polished. The metal-silicon carbide composite is used as a component for dissipating heat generated from electronic and electric components, that is, as a heat dissipation component. This heat dissipation component is screwed to another component such as a heat dissipation fin for heat dissipation or a product outer frame such that a module is formed. Therefore, in the metal-silicon carbide composite, a hole portion for screwing may be formed in an outer periphery or in the vicinity of the outer periphery in advance.

As a method of forming the hole portion, various methods are known. For example, as described in Patent Documents 1 and 2, a method of impregnating, with metal, a compact in which a hole is formed at a predetermined position in advance using a pin during the formation or a compact in which a hole portion is provided by processing a predetermined position after the preparation and subsequently machining the metal portion is to form the hole portion is known.

RELATED DOCUMENT

Patent Document

[Patent Document 1] Japanese Patent Application No. 3468358
[Patent Document 2] Japanese Patent Application No. 3662221

SUMMARY OF THE INVENTION

Technical Problem

The metal-silicon carbide composite tends to obtain high reliability as the heat dissipation component as described above. However, as the market needs increase, required performance with respect to reliability has been increasing.

For example, recently, it has been required that the occurrence of cracking is suppressed even under harsher heat cycle conditions than those in the related art. However, in the related art, thermal stress generated due to a difference in thermal expansion coefficient between a metal portion and a metal-silicon carbide composite during a heat cycle increases, and there is a problem in that cracking is likely to occur.

That is, a metal-silicon carbide composite or a heat dissipation component that has higher cracking resistance than that in the related art and satisfies recent harsh reliability requirements is required.

The present invention has been made under these circumstances. An object of the present invention is to provide a heat dissipation member that has higher cracking resistance than that in the related art and satisfies harsher reliability requirements.

Solution to Problem

As a result of a thorough investigation, the present inventors made the present invention provided below and achieved the above-described object.

According to the present invention, there is provided a heat dissipation member that is substantially rectangular flat, the heat dissipation member including:

a composite portion where silicon carbide having voids is impregnated with metal; and a metal portion that is different from the composite portion, a proportion of a volume of the metal portion to a total volume of the heat dissipation member is 2.9% or higher and 12% or lower, when a length of a diagonal line of the heat dissipation member is represented by L, in a top view where one main surface of the heat dissipation member is atop surface, 40% or higher of the total volume of the metal portion is present in a region D within a distance of L/6 from an apex of any one of four corners of the heat dissipation member, and a hole that penetrates the metal portion in the region D is provided.

Advantageous Effects of Invention

The present invention provides a heat dissipation member that has higher cracking resistance than that in the related art and satisfies harsher reliability requirements.

BRIEF DESCRIPTION OF THE DRAWINGS

The above-described object, other objects, characteristics, and advantageous effects will be further clarified using preferred embodiments described below and the accompanying drawings below.

is a top view of the heat dissipation member where one main surface is atop surface and (b) is a cross-sectional view taken along line A-A' of (a).

Figure 2:
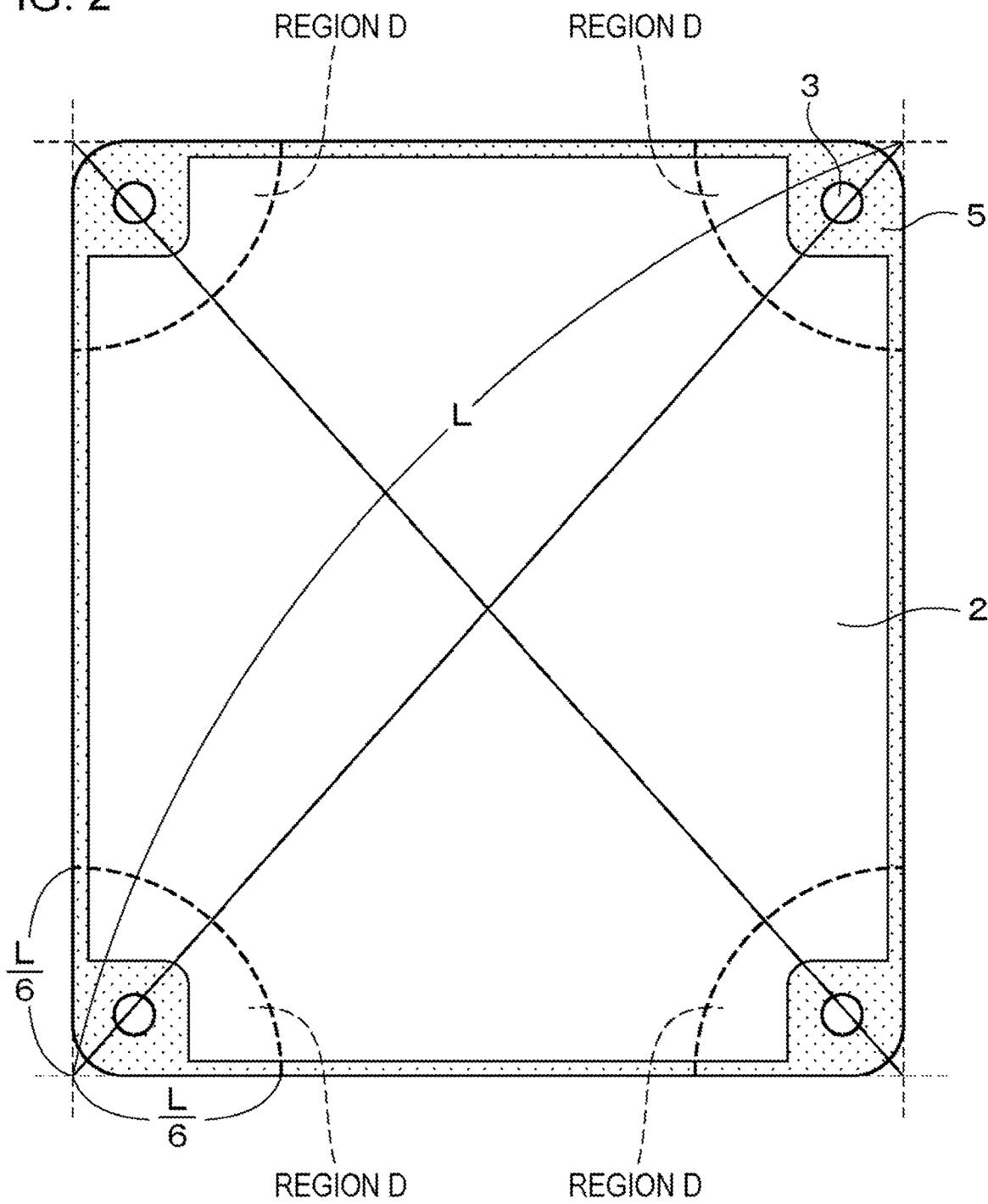

FIG. 2 is a schematic diagram illustrating the heat dissipation member according to the first embodiment, in which auxiliary lines or the like are added for convenience of description.

Figure 1:
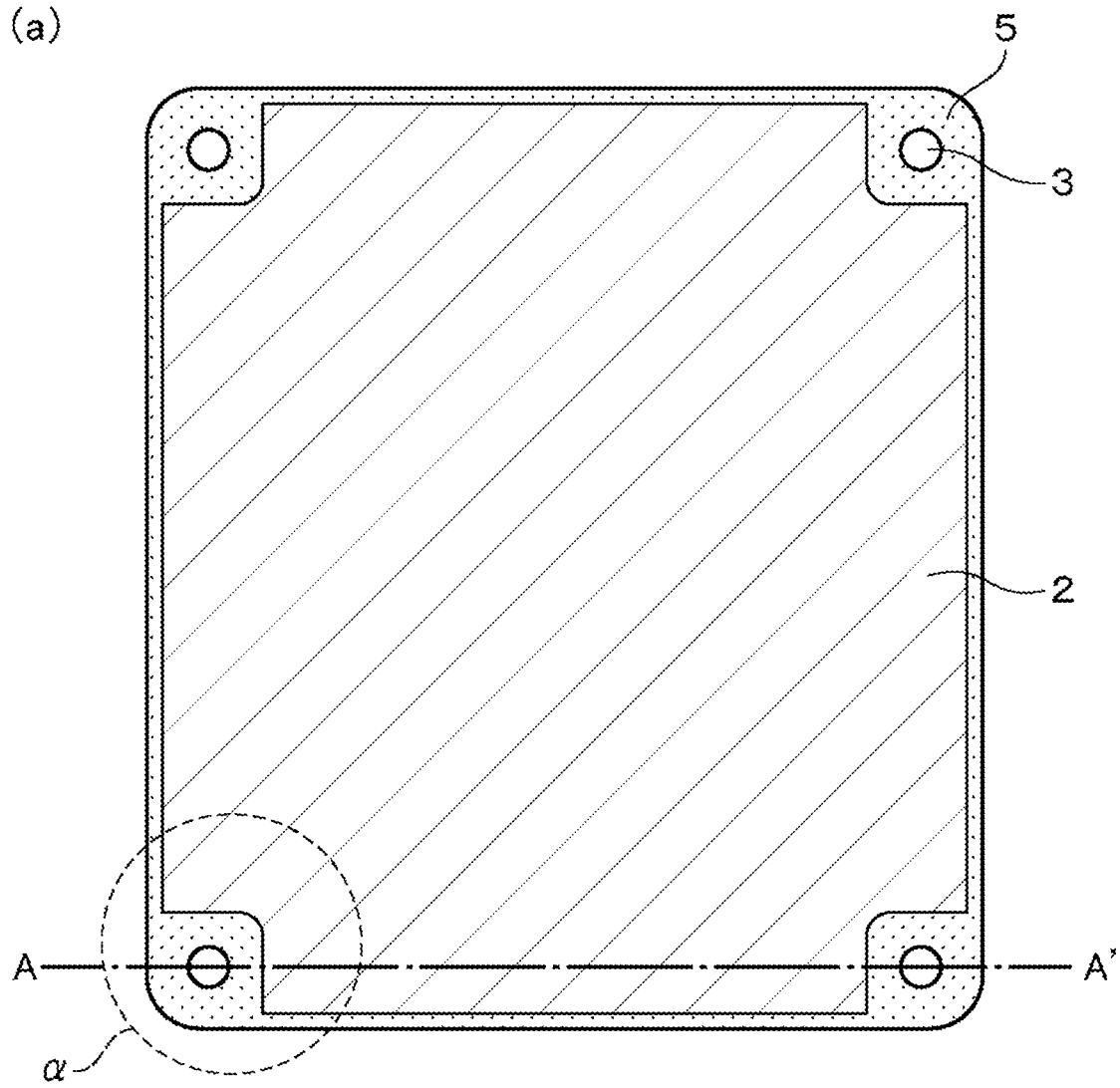
FIG. 1 is a schematic diagram illustrating a heat dissipation member according to a first embodiment, in which (a)
Figure 1:
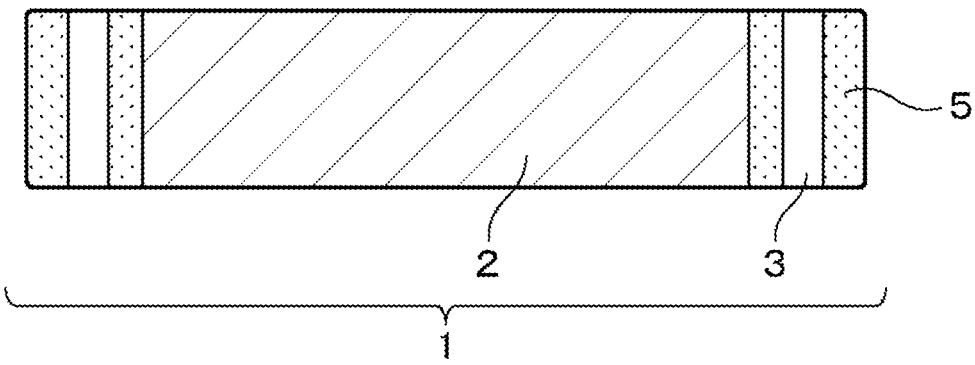
Figure 3:
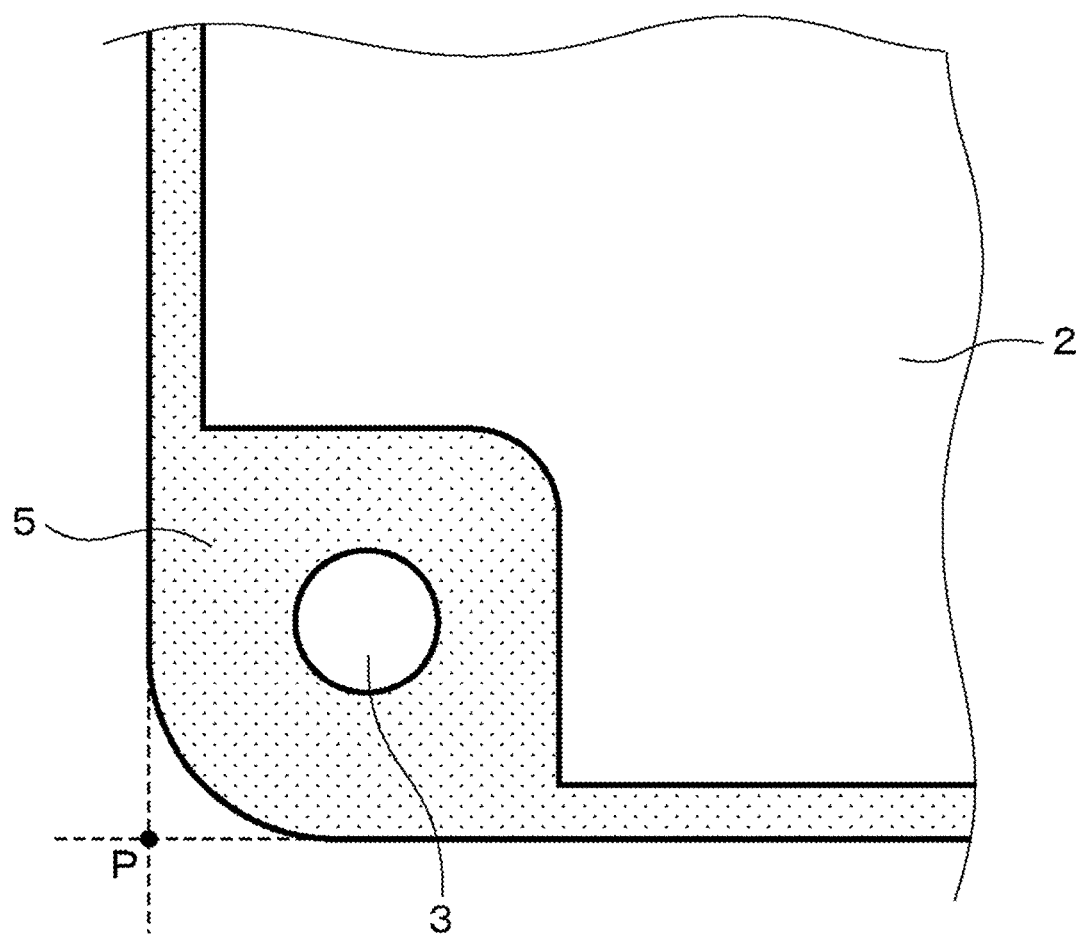

FIG. 3 is an enlarged view illustrating a portion indicated by a in (a) of FIG. 1, in which auxiliary lines or the like are added for convenience of description.

Figure 4:
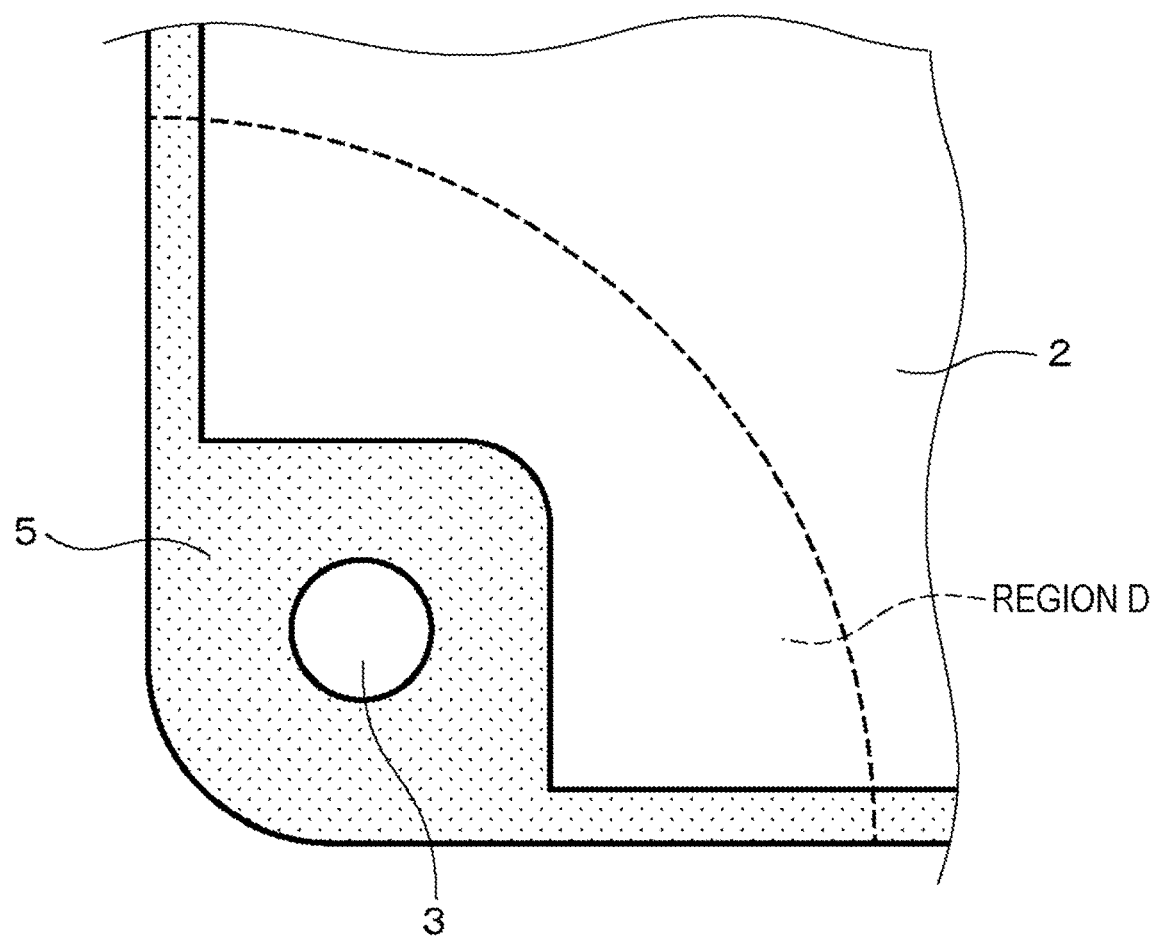

FIG. 4 is an enlarged view illustrating a portion indicated by a in (a) of FIG. 1, in which auxiliary lines or the like are added for convenience of description.

Figure 5:
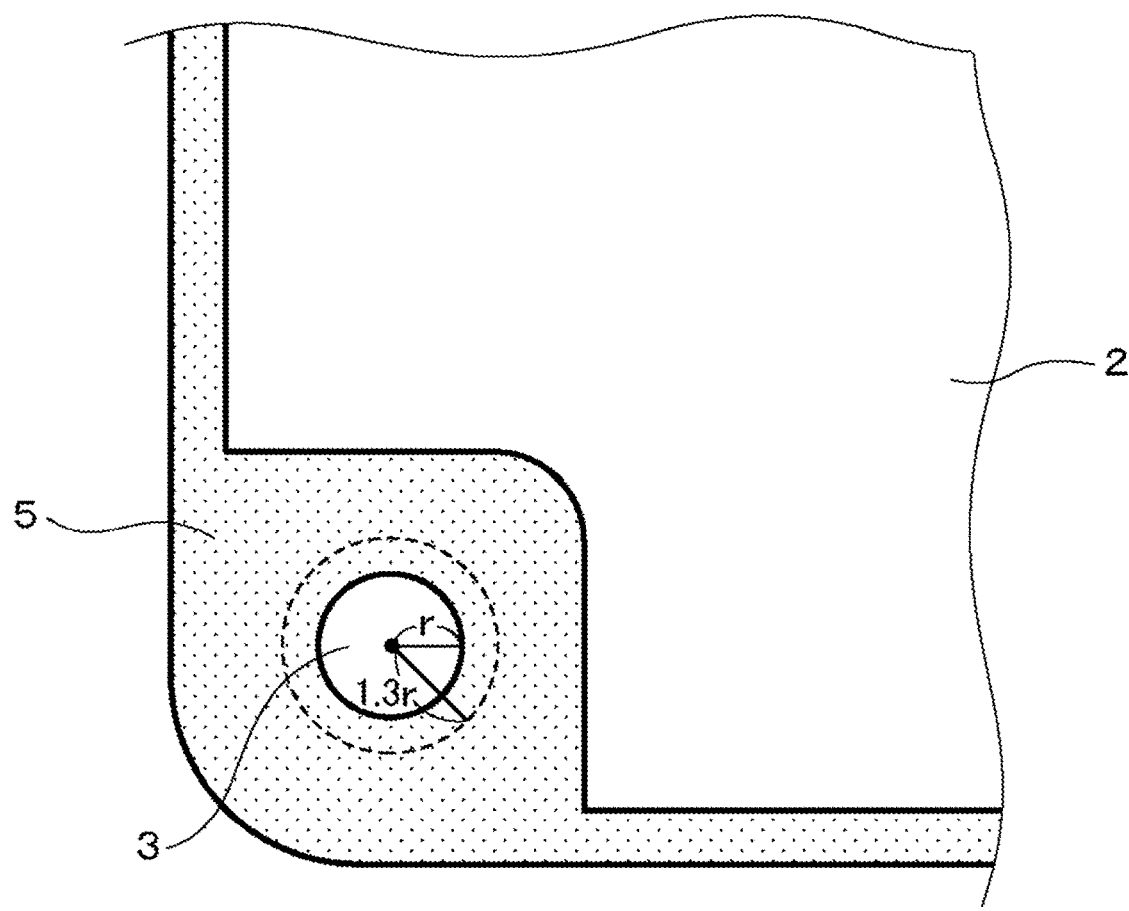

FIG. 5 is a schematic diagram illustrating the heat dissipation member according to the first embodiment, in which auxiliary lines or the like are added for convenience of description.

Figure 6:
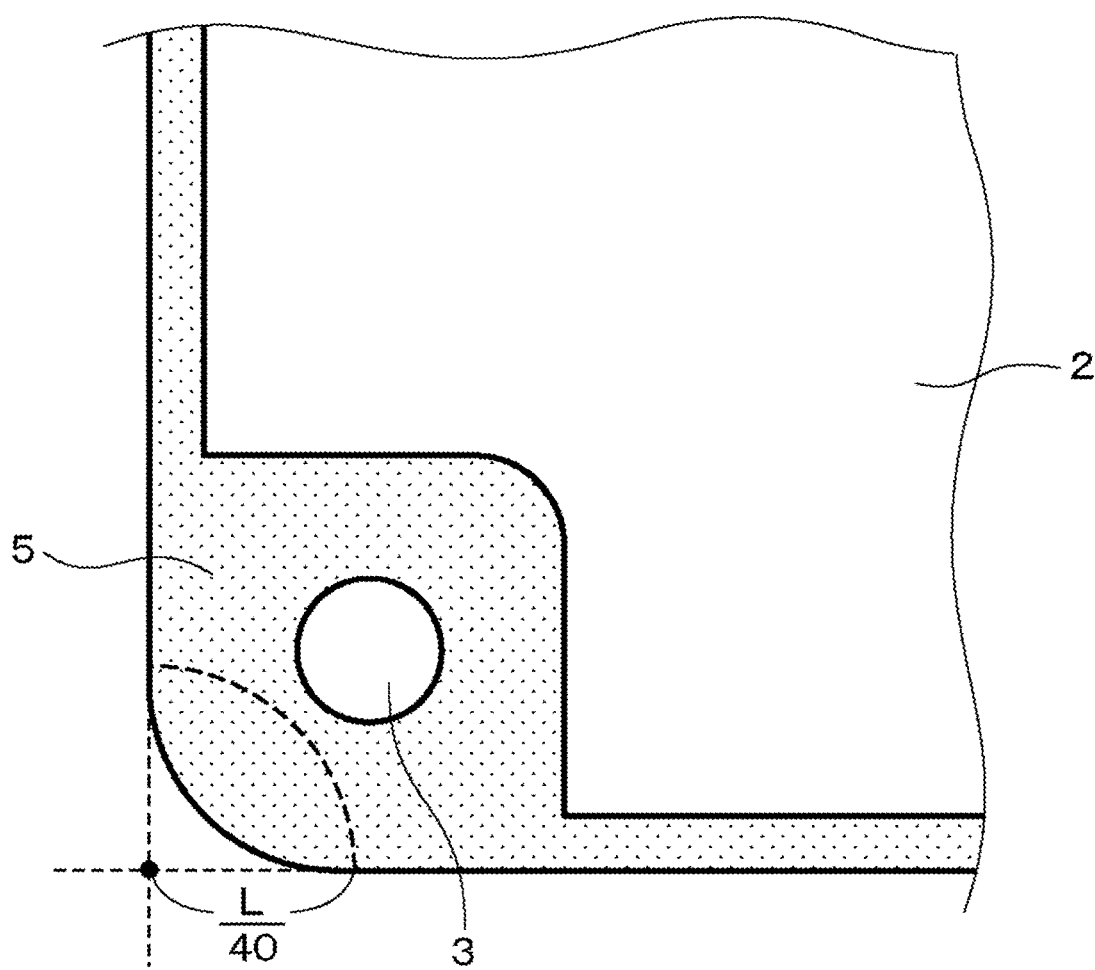

FIG. 6 is a schematic diagram illustrating the heat dissipation member according to the first embodiment, in which auxiliary lines or the like are added for convenience of description.

Figure 7:
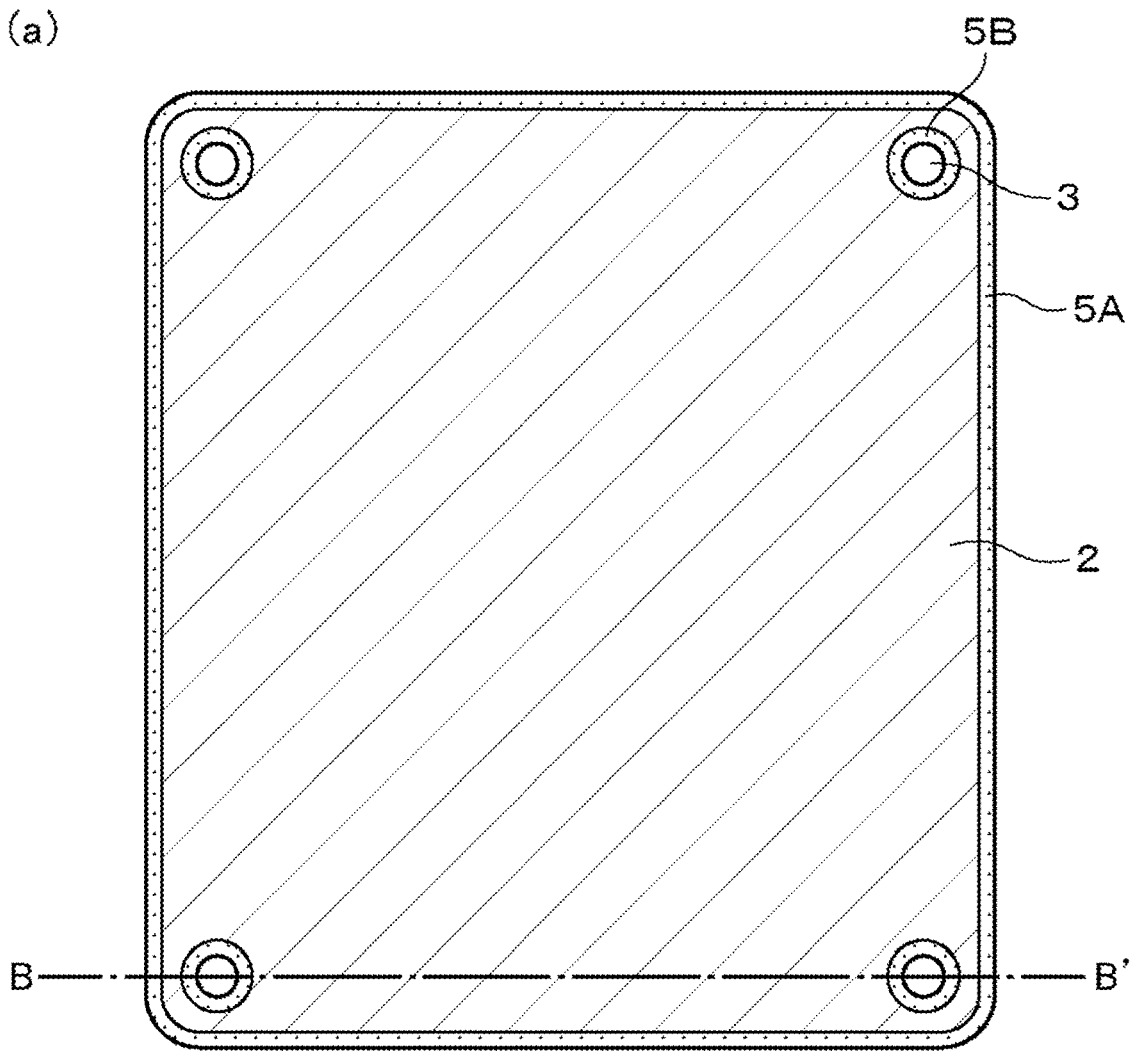
Figure 7:
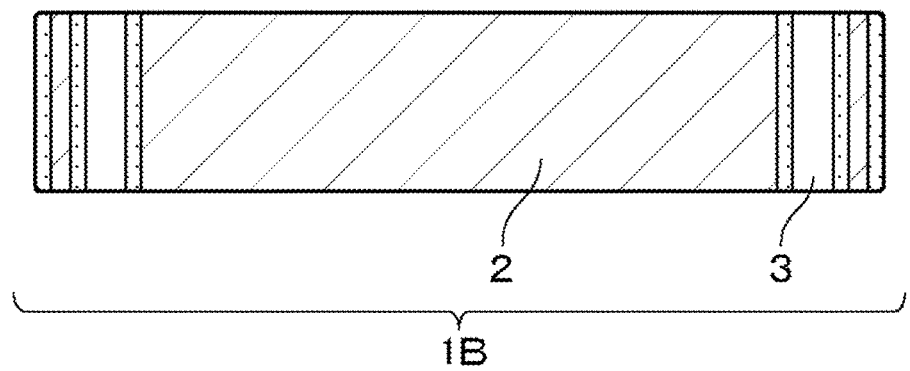

FIG. 7 is a schematic diagram illustrating a heat dissipation member according to a second embodiment, in which (a) is a top view of the heat dissipation member where one main surface is a top surface and (b) is a cross-sectional view taken along line B-B' of (a).

Figure 8:
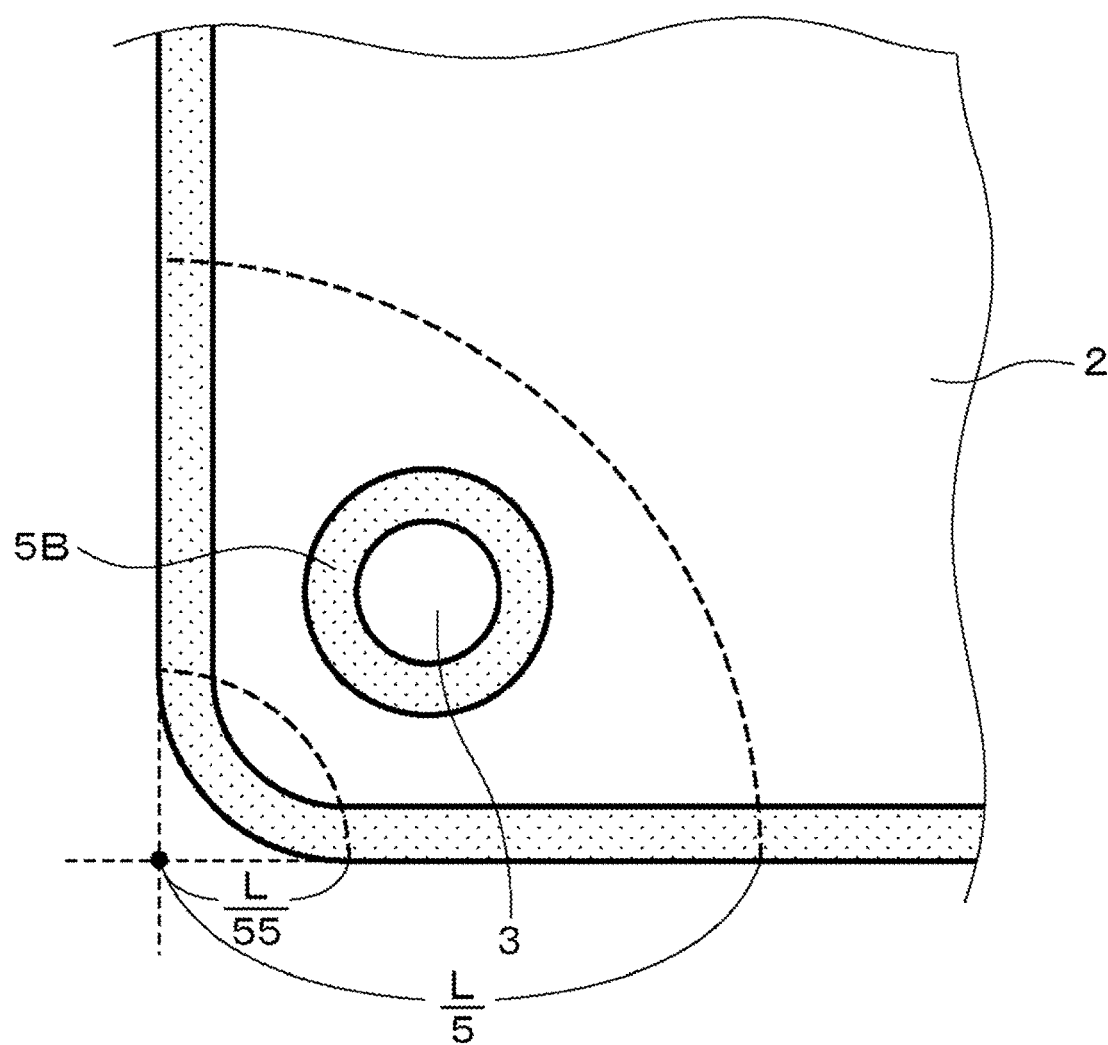

FIG. 8 is a schematic enlarged view illustrating a part of the heat dissipation member according to the second embodiment, in which auxiliary lines or the like are added for convenience of description.

Figure 9:
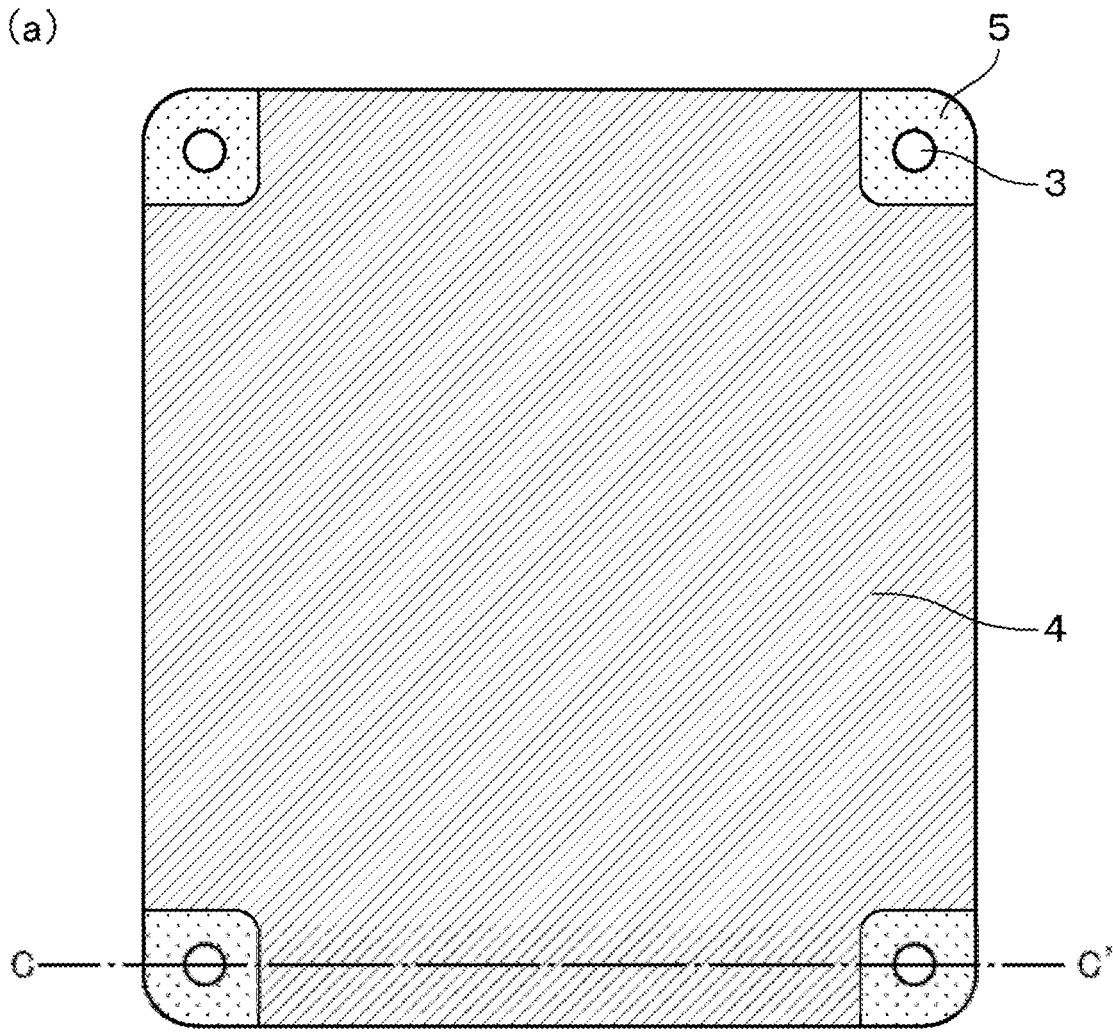
Figure 9:
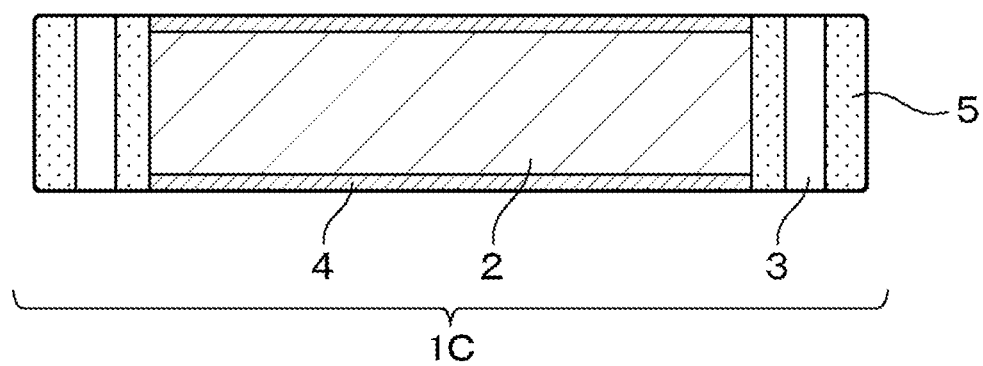

FIG. 9 is a schematic diagram illustrating a heat dissipation member according to a third embodiment, in which (a) is a top view of the heat dissipation member where one main surface is a top surface and (b) is a cross-sectional view taken along line C-C' of (a).

Figure 10:
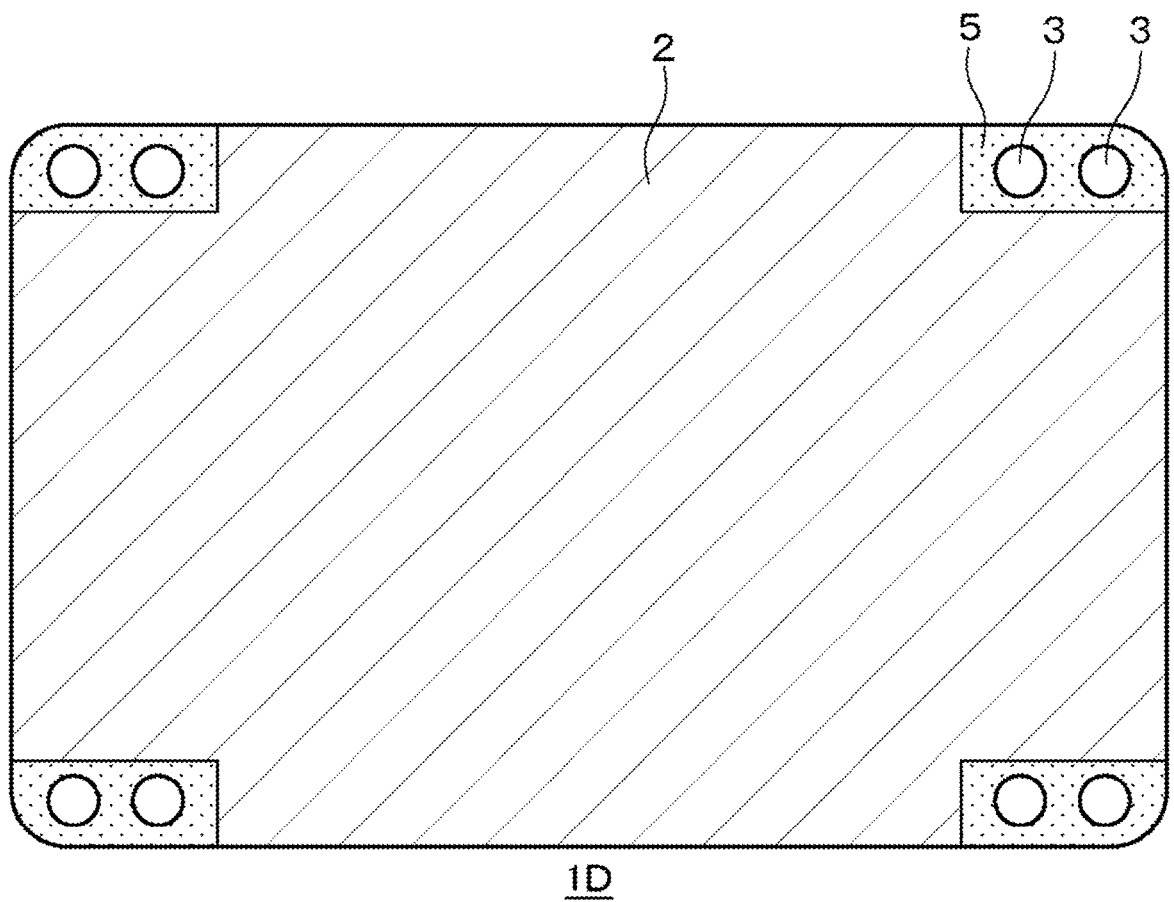

FIG. 10 is schematic diagram illustrating a heat dissipation member according to a fourth embodiment and is a top view of the heat dissipation member where one main surface is a top surface.

Figure 11:
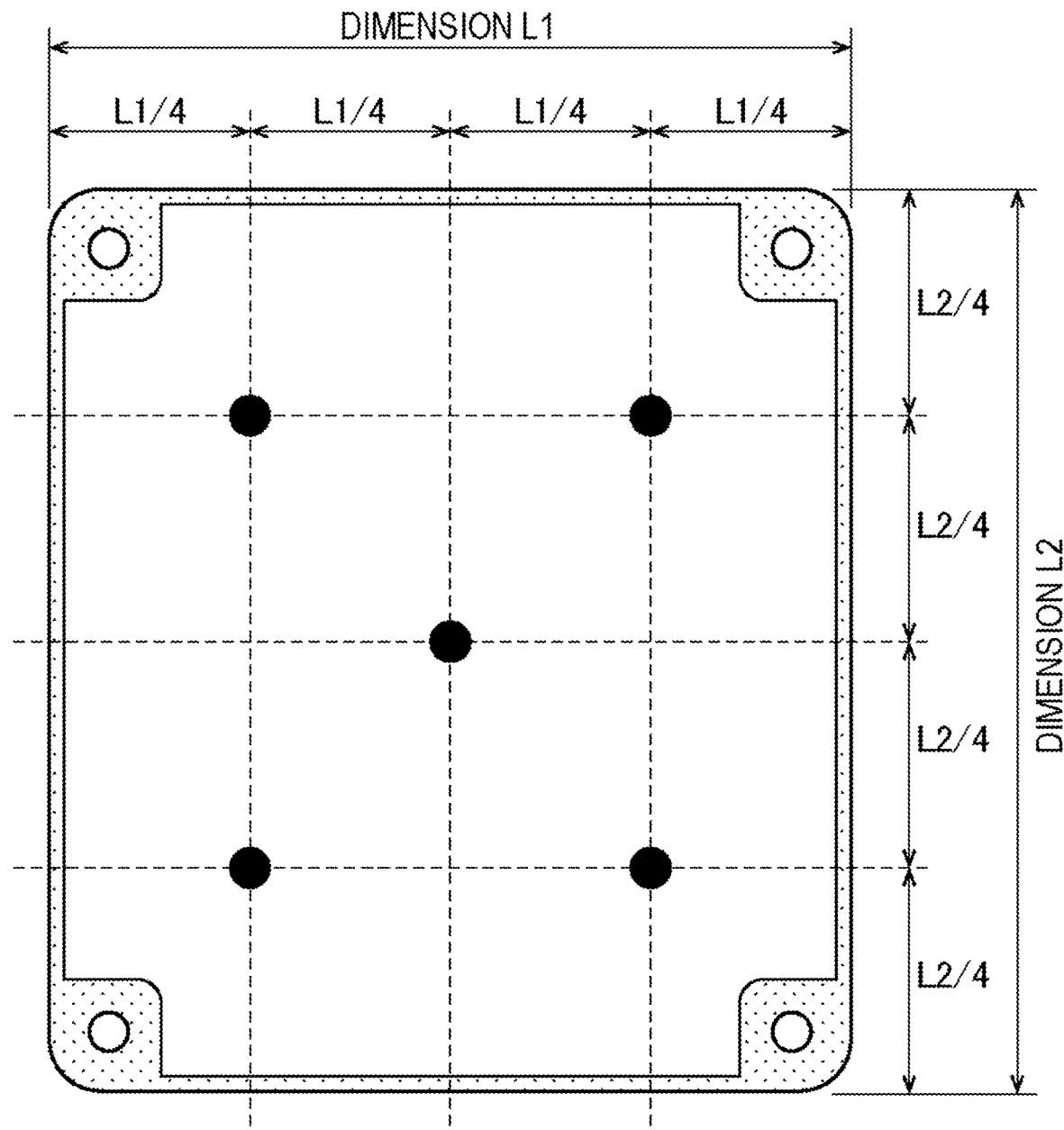

FIG. 11 is a diagram illustrating measurement positions for acquiring the volume of the heat dissipation member.

DESCRIPTION OF EMBODIMENTS

Hereinafter, embodiments of the present invention will be described in detail with reference to the drawings.

In all the drawings, the same components are represented by the same reference numerals, and the description thereof will not be repeated.

In order to avoid complication, (i) when a plurality of the same components are present on the same drawing, there may be a case where the reference numeral is given to only one component without giving the reference numeral to all the components; and (ii) in the drawings after FIG. 2, there may be a case where the reference numeral is not given again to the same components as those of FIG. 1.

All the drawings are merely illustrative. The shapes, a dimensional ratio, and the like of each of members in the drawings do not necessarily correspond to those of an actual product. In addition, in particular, FIGS. 2 to 6 are enlarged views illustrating a part of (a) of FIG. 1 and, for example, for easy understanding of the description, a relative size or the like of each of portions does not necessarily match that of (a) of FIG. 1.

In the present specification, unless explicitly specified otherwise the term "substantially" is intended to include a range defined in consideration of manufacturing tolerances, assembly variations, and the like.

First Embodiment

FIG. 1 is a schematic diagram illustrating a heat dissipation member (heat dissipation member 1) according to a first embodiment.

(a) of FIG. 1 is a top view of the heat dissipation member 1 where one main surface is a top surface, and (b) of FIG. 1 is a cross-sectional view taken along line A-A' of (a) of FIG. 1.

As illustrated in (a) of FIG. 1, the heat dissipation member 1 is a substantially rectangular flat plate. That is, the heat dissipation member 1 is substantially rectangular flat in a top view where one main surface is a top surface.

Typically, the heat dissipation member 1 includes a metal portion 5 at four corners.

In addition, a part of the metal portion 5 may be continuously provided in a peripheral portion of the heat dissipation member 1. Here, when the length of a short side is represented by L1 and the length of a long side is represented by L2 in the top view where one main surface of the heat dissipation member 1 is a top surface, "peripheral portion" refers to a region within L2/10 in an inner direction of the heat dissipation member 1 from a short side or within L1/10 in an inner direction of the heat dissipation member 1 from a long side.

On the other hand, typically, a portion of the heat dissipation member 1 other than the metal portion 5 is configured with a composite portion 2 where silicon carbide having voids is impregnated with metal (hereinafter, also simply referred to as "composite portion 2"). The proportion of the volume of the metal portion 5 to the total volume of the heat dissipation member 1 is 2.9% or higher and 12% or lower.

FIG. 2 is an additional diagram illustrating the heat dissipation member 1, in which some auxiliary lines or characters are added to the heat dissipation member 1 of (a) of FIG. 1.

In FIG. 2, the length of a diagonal line of the rectangular flat heat dissipation member 1 is represented by L. In addition, in the top view where one main surface of the heat dissipation member 1 is a top surface, a region within a distance of L/6 from an apex of any one of four corners of the heat dissipation member 1 is represented by "region D".

Here, the heat dissipation member 1 includes a hole 3 that penetrates the metal portion 5 present in the region D. Typically, the hole 3 penetrates only the metal portion 5 and does not pass through the composite portion 2. In addition, typically, the hole 3 is provided to penetrate a gap between main surfaces of the heat dissipation member 1 and preferably to be substantially perpendicular to the main surface of the heat dissipation member 1. By inserting a fixing member such as a screw into the hole 3, the heat dissipation member 1 can be fixed to another component.

In addition, 40% or higher of the total volume of the metal portion 5 is present in the region D.

Supplementarily, the heat dissipation member 1 being "substantially rectangular" represents that, for example, as illustrated in FIG. 1, at least one of the four corners of the heat dissipation member 1 may have a slightly rounded shape without being linear (of course, the four corners may be linear).

Here, when at least one of the four corners of the heat dissipation member 1 has a rounded shape, the rectangular "apex" can be defined as illustrated in FIG. 3 (FIG. 3 is an enlarged view illustrating a portion indicated by a in (a) of FIG. 1). That is, an intersection point P when straight line portions of a short side and a long side of the heat dissipation member 1 in the top view are extended can be defined as "apex". In addition, the point P determined as illustrated in FIG. 3 can be defined as a starting point or an end point when the length "L" in FIG. 2 is measured.

The reason why the heat dissipation member such as the heat dissipation member 1 has higher cracking resistance than that in the related art and satisfies harsh reliability requirements can be described as follows.

The heat dissipation member 1 will be roughly described. The heat dissipation member 1 has the following characteristics including:

(1) a proportion of a volume of the metal portion 5 to a total volume of the heat dissipation member 1 is 2.9% or higher and 12% or lower;

(2) most or the entirety of the metal portion 5 is present in portions near the four corners of the heat dissipation member 1; and (3) through holes (holes 3) are provided in portions of the metal portion 5 close to the four corners.

Here, by adjusting the proportion of the volume of the metal portion 5 to the total volume of the heat dissipation member 1 to be "2.9% or higher" and causing most or the entirety of the metal portion 5 to be present in the portions near the four corners of the heat dissipation member 1, the holes 3 having a suitable (sufficiently large) size for being attached to another component can be provided in the metal portion 5. As a result, it is presumed that the heat dissipation member 1 can be reliably attached to another component, which leads to improvement of reliability.

On the other hand, the metal portion 5 and the composite portion 2 have different thermal expansion coefficients, and the proportion of the volume of the metal portion 5 to the total volume of the heat dissipation member 1 is "12% or lower". As a result, thermal stress generated by a heat cycle can be reduced. This configuration is effective to reduce cracks (in particular, to reduce cracks in the vicinity of an interface between the composite portion 2 and the metal portion 5 present in the region D).

It is presumed that the through holes (holes 3) are present in the metal portion 5 where "fracturing is suppressed" or "cracks are not likely to be formed" as compared to the composite portion 2 such that cracks in the vicinity of the through holes, that is, in the vicinity of the portions screwed with screws are reduced (it is presumed that, even when a force is applied to the holes 3 present in the metal portion 5 through the screws, cracking is suppressed due to punch stretchability of the metal).

Further, the elastic modulus of the metal portion 5 tends to be lower than that of the composite portion 2. This configuration leads to an advantageous effect in that fracturing or the like is not likely to occur when the holes 3 are formed or fracturing or the like is not likely to occur when the heat dissipation member 1 is attached to another component with screws or the like (a low elastic modulus leads to easy absorption of impact).

This advantageous effect represents that the heat dissipation member 1 can be easily attached to another component with screws, which is preferable from the viewpoint of productivity or the like.

Supplementarily, the reduction of cracking or the improvement of reliability described above is at a much higher level than that achieved in the related art.

For example, Examples of Patent Document 2 show that cracking or fracturing did not occur even when a heat cycle of 30 minutes at −40° C. and 30 minutes at 125° C. was repeated 300 times. However, in the heat dissipation member according to the first embodiment (and the heat dissipation members according to second and third embodiments described below), even when a heat cycle of 30 minutes at −40° C. and 30 minutes at 150° C. that is harsher than the conditions of Examples of Patent Document 2 (that is 25° C. higher than the conditions of Examples of Patent Document 2) is repeated 300 times, cracking or fracturing can be suppressed.

From the viewpoint of further reducing cracking, the proportion of the volume of the metal portion 5 to the total volume of the heat dissipation member 1 is preferably 3.0% or higher and 11.8% or lower and more preferably 3.2% or higher and 11.5% or lower.

It is preferable that the thickness of the metal portion 5 present in the region D is substantially the same as the thickness of the composite portion 2. The metal portion 5 in the vicinity of the hole 3 is sufficiently thicker than the composite portion 2 such that sufficient toughness, higher cracking resistance, and the like can be obtained.

Here, the thicknesses being "substantially the same" represents that (the thickness of the metal portion 5/the thickness of the composite portion 2) is, for example, 0.8 or higher and 1.2 or lower and preferably 0.9 or higher and 1.1 or lower.

Supplementarily, as "the thickness of the composite portion 2" described herein, for example, a thickness acquired using a thickness measurement method described below with reference to FIG. 11 can be adopted. In addition, when the metal portion 5 is continuously present from the top surface to the bottom surface of the heat dissipation member 1 as illustrated in FIG. 1, "the thickness of the metal portion 5" can be obtained, for example, by measuring the metal portion 5 using a micrometer or a caliper. Of course, the method of acquiring the thickness is not limited to the above-described method, and any method capable of measuring the thickness with a certain level of accuracy can be adopted.

Supplementarily, in FIG. 2, the metal portions 5 having substantially the same volume (substantially the same area in the top view) are present in the four regions D present at the four corners. From the viewpoints of, for example, achieving the reliability of the heat dissipation member 1 as a whole and preventing excessive stress from being applied to only a specific portion, it is preferable that the metal portions 5 having substantially the same volume are present in the four regions D.

More specifically, when the volume of the metal portion 5 in the region D having the highest volume of the metal portion 5 among the four regions D present at the four corners is represented by Vmax and the volume of the metal portion 5 in the region D having the lowest volume of the metal portion 5 among the four regions D present at the four corners is represented by Vmin, the value of Vmax/Vmin is preferably 1 or higher and 1.2 or lower.

When the volume of the metal portion 5 present in the region D is represented by $V_{metal}$ and the volume of the hole 3 in the region D is represented by $V_{hole}$, the value of $V_{hole}/(V_{metal}+V_{hole})$ is preferably 0.60 or lower, more preferably 0.55 or lower, and still more preferably 0.50 or lower. The lower limit of the value of $V_{hole}/(V_{metal}+V_{hole})$ is not particularly limited and, from the viewpoint of manufacturing suitability or the like, is, for example, 0.1 or higher, preferably 0.3 or higher, and more preferably 0.5 or higher.

Just in case, supplementarily, the volume $V_{hole}$ of the hole 3 refers to the volume of the hole 3 present between two main surfaces. For example, when the hole 3 is cylindrical and is provided to be substantially perpendicular to the main surface of the heat dissipation member 1, $V_{hole}$ can be acquired by calculating "the area of the hole 3×the thickness of the heat dissipation member 1 in the vicinity of the hole 3 in the top view where one main surface of the heat dissipation member 1 is a top surface". In other words, it can be said that $V_{hole}$ is the volume of a portion "cut out" from the heat dissipation member 1 to provide the hole 3 in the heat dissipation member 1.

FIG. 4 is an enlarged view illustrating a portion indicated by a in (a) of FIG. 1 (an enlarged view illustrating one of the four corners of the heat dissipation member 1). In FIG. 4, when the volume of the metal portion 5 present in the region D is represented by $V_{metal}$ and the volume of the hole 3 is represented by $V_{hole}$, the value of $V_{hole}/(V_{metal}+V_{hole})$ is preferably in the above-described numerical range.

The above-described matter represents that the size of the hole 3 is less than (not more than) that of the metal portion 5 present in the region D. As a result, the metal can be made to be present in the region D in an amount that can sufficiently withstand stress (in particular, stress applied to the vicinity of the hole 3) generated by a heat cycle. Accordingly, the reduction of cracking or the like can be realized at a higher level.

From another viewpoint, it is preferable that, as illustrated in FIG. 5, when the radius of the hole 3 is represented by r in the top view of the heat dissipation member 1 where one main surface of the heat dissipation member 1 is a top surface, the composite portion 2 is not present in a region within a distance of 1.3 r from the center of the hole 3. It is more preferable that the composite portion 2 is not present in a region within a distance of 1.5 r from the center of the hole 3. In other words, it is preferable that only the hole 3 itself or the metal portion 5 is present in the region within a distance of 1.3 r from the center of the hole 3.

The above-described matter represents that the size of the hole 3 is less than (not more than) that of the metal portion 5 present in the region D and the hole 3 is present "in the vicinity of the center" without being at "an edge" of the metal portion 5 present in the region D. As a result, when the heat dissipation member 1 is attached with a screw, the entire "head" of the screw can be easily made to be present within the region of the metal portion 5, and the occurrence of fracturing or the like during the attachment can be suppressed. In addition, the metal portion 5 as a whole present in the region D can more uniformly withstand stress (in particular, stress applied to the vicinity of the hole 3) generated by a heat cycle, and the reduction of cracking or the like can be realized at a higher level.

Supplementarily, if the shape of the hole 3 in a top view cannot be substantially considered a true circle, the geometric center of gravity of the hole 3 can be adopted as "the center of the hole 3", and the radius of a circle having the same area as that of the hole 3 can be adopted as "the radius of the hole 3".

Further, from another viewpoint, as illustrated in FIG. 6, in the top view of the heat dissipation member 1 where one main surface of the heat dissipation member 1 is a top surface, it is preferable that the hole 3 is not present in a region within a distance of L/40 from an apex P of the heat dissipation member 1 (L represents the length of a diagonal line of the heat dissipation member 1 as described above. It is more preferable that the hole 3 is not present in a region within a distance of L/35 from the apex P.

The above-described matter represents that the hole 3 is provided in a position at a certain distance from an edge (apex) without being at "the very edge" of heat dissipation member 1. As a result, it is presumed that a technical effect can be obtained in that, for example, the heat dissipation member 1 as a whole can uniformly withstand stress or excessive stress is not applied to only the vicinity of the hole 3. That is, it is presumed that the effect of further reducing cracking or the like can be obtained.

As described above, the metal portion 5 may be continuously provided in a peripheral portion of the heat dissipation member 1. In other words, when the heat dissipation member 1 is seen from an outer peripheral surface direction, a part of the metal portion 5 may be a structure that is formed in a part or the entirety of the outer peripheral surface.

The metal portion 5 is also present in the outer peripheral surface of the heat dissipation member 1 without being present only in the vicinity of the hole 3 or only in the vicinity of the four corners of the heat dissipation member 1 such that the metal portion 5 as a whole can uniformly withstand stress. As a result, cracking or the like can be further reduced.

In the first embodiment, the hole 3 is provided only in the four corners of the heat dissipation member 1. However, the hole 3 may be present in a portion other than the four corners of the heat dissipation member 1 in consideration of a configuration of another component to which the heat dissipation member 1 is attached, characteristics of various materials forming the heat dissipation component, and the like. For example, the additional hole 3 may be provided, for example, in the vicinity of an intermediate point of a long side of the heat dissipation member 1.

In addition, in the first embodiment, one hole 3 is provided in one region D. However, a plurality of holes 3 may be provided in one region D.

The lengths of the heat dissipation member 1 are, for example, about in a range of 60×100 mm to 140×200 mm.

The thickness of the heat dissipation member 1 is, for example, 2 mm or more and 6 mm or less and preferably 3 mm or more and 5 mm or less.

The radius r of the hole 3 is, for example, 3 mm or more and 12 mm or less.

The material of the metal portion 5 or the composite portion 2 will be described.

The metal portion 5 may be metal containing any one of aluminum, copper, magnesium, silver, and the like as a main component (50 mass % or higher). By adopting this metal as the material of the metal portion 5, the heat dissipation member 1 may have a thermal conductivity, a thermal expansion coefficient, and the like suitable as a heat dissipation component.

The metal portion 5 is formed of preferably metal containing aluminum or magnesium as a main component or more preferably metal containing aluminum as a main component.

The metal portion 5 may include other elements in addition to the above-described metal as the main component. For example, it is preferable that the metal portion 5 contains aluminum as a main component, 0.1 mass % or higher and 1.5 mass % or lower of magnesium, and 0.1 mass % or higher and 18 mass % or lower of silicon. By alloying silicon or magnesium with aluminum, the melting point of the alloy or the viscosity of molten metal at a high temperature decreases, which is advantageous in that a dense composite can be easily obtained by high temperature casting or the like.

It is preferable that the metal portion 5 contains, for example, an inorganic fiber in addition to the metal. The metal portion 5 contains the inorganic fiber such that the occurrence of shrinkage cavities during the manufacturing of the heat dissipation member 1 can be suppressed (for example, the maximum value of the size of the shrinkage cavities can be easily made to be 1.0 mm$^2$ or less). A method of manufacturing the heat dissipation member 1 will be described below.

In addition, the metal portion 5 contains the inorganic fiber such that the toughness of the hole 3 and the metal portion 5 in the vicinity of the hole 3 can be increased.

Further, the metal portion 5 contains the inorganic fiber such that a difference in thermal expansion coefficient from the composite portion 2 can be reduced and the thermal stress generated by a heat cycle can be further reduced.

Examples of a material of the inorganic fiber include metal, a metal oxide, glass, and carbon. Among these, a metal oxide is preferable, and alumina or silica fiber is more preferable.

In particular, when the metal of the metal portion 5 as the main component is aluminum, it is preferable that the metal portion 5 contains alumina fiber from the viewpoint of affinity to aluminum. It is more preferable that the alumina fiber is crystalline alumina fiber where the alumina content is 70% or higher from the viewpoint of affinity to aluminum.

From the viewpoint of exhibiting the above-described effects with a good balance or easily processing the hole 3, the amount of the inorganic fiber with respect to a total volume of the metal portion 5 is preferably 3 vol % or higher and 30 vol % or lower and more preferably 5 vol % or higher and 28 vol % or lower.

Typically, in the composite portion 2, silicon carbide (also referred to as "preform" or the like) having voids is impregnated with metal.

The silicon carbide having voids can be obtained, for example, by preparing one kind or two or more kinds of silicon carbide particles having an average particle size of 1 μm or more and 300 μm or less, compressing and molding the particles, and further heating and calcinating the compact. Here, the relative density of the silicon carbide (the compact of the silicon carbide having voids before being impregnated with the metal) is preferably 55% or higher and 75% or lower, more preferably 57% or higher and 73% or lower, and still more preferably 60% or higher and 70% or lower.

By adjusting the relative density of the silicon carbide to be 55% or higher and 75% or lower, the thermal expansion coefficient of the heat dissipation member 1 can be easily designed to be 6 ppm/K or higher and 10 ppm/K or lower. Due to this design, thermal stress generated by a heat cycle can be further reduced.

The relative density of the silicon carbide is defined as the volume proportion of the silicon carbide to the volume of the compact of the silicon carbide having voids before being impregnated with the metal.

During the preparation of the compact, a binder can be mixed in addition to the silicon carbide. The proportion of the binder remaining in the compact is typically 10% or lower with respect to the relative density of the silicon carbide.

It is preferable that the metal with which the composite portion 2 is impregnated and the metal contained in the metal portion 5 are the same (in the case of an alloy, the alloy composition is the same).

First, this configuration relates to a manufacturing method described below. That is, when the composite portion 2 and the metal portion 5 are collectively formed by impregnating the compact of the silicon carbide with the metal, the metal with which the composite portion 2 is impregnated and the metal contained in the metal portion 5 are the same. In conclusion, by making the metal with which the composite portion 2 is impregnated and the metal contained in the metal portion 5 to be the same, there is an advantageous effect in that the manufacturing is easy.

In addition, by making the metal with which the composite portion 2 is impregnated and the metal contained in the metal portion 5 to be the same, the thermal expansion coefficients of the respective portions can be easily made uniform, and thermal stress can be easily further reduced.

(Method of Manufacturing Heat Dissipation Member 1)

The method of manufacturing the heat dissipation member 1 will be described. Of course, the method of manufacturing the heat dissipation member 1 is not limited only to the method described below. The heat dissipation member 1 may be manufactured using various well-known methods.

For example, the heat dissipation member 1 can be manufactured in the following procedure.

(1) A step of forming a flat compact (having voids) that includes a cut-out portion and contains silicon carbide.

(2) A step of disposing inorganic fiber in the cut-out portion of the compact.

(3) A step of forming the composite portion 2 and the metal portion 5 by impregnating the compact and the inorganic fiber with metal.

(4) A step of cutting the compact impregnated with the metal into a shape of the flat heat dissipation member 1.

("Cut-out portion" in (1) or (2) represents that, for example, portions (for example, the four corner portions) corresponding to the metal portion 5 of the finally obtained heat dissipation member 1 are absent in the rectangular flat compact.)

The above-described procedure will be described in more detail.

In (1) the step of forming a flat compact (having voids) that includes a cut-out portion and contains silicon carbide, As a method of forming the silicon carbide powder as a raw material, a well-known method such as a dry press method, a wet press method, an extrusion molding method, an injection method, a casting method, or a method of punching out after sheet-molding can be used.

At this time, in order to exhibit a strength such that abnormalities such as fracturing during impregnation with the metal do not occur, an inorganic or organic binder may be appropriately added. In order to easily obtain a high-strength compact, a silica sol is preferable as the binder. It is more preferable that the volume ratio of the binder added is 20 or less with respect to 100 of the silicon carbide in terms of solid content from the viewpoint of improving the relative density.

For example, when the wet press method is applied, a method may be adopted in which porous convex and concave molds are prepared, a slurry containing the silicon carbide powder, the binder, water, and the like as components is charged into the concave mold, and the components are compression-molded with the convex mold. When the wet press method is applied, for example, the cut-out portion may be formed in the compact such that the metal portion 5 forms a part of the outer peripheral surface of the heat dissipation member 1 as illustrated in FIG. 1.

The cut-out portion can be formed by using a mold having a desired shape of the cut-out portion, preferably, during compression molding. In addition, the cut-out portion can also be formed by mechanically processing (for example, machining or cutting) the plate-shaped compact.

Although depending on manufacturing conditions, in order to obtain a compact having a predetermined strength, the compact manufactured as described is typically calcinated after drying, heating, and degreasing.

Regarding calcination conditions, it is preferable to calcinate the compact in an inert atmosphere or air at a temperature of 700° C. or higher. However, when the compact is calcinated in air at a temperature of 1100° C. or higher, the thermal conductivity of the composite obtained by oxidizing the silicon carbide may decrease. Accordingly, it is preferable to calcinate the compact at this temperature or lower.

As described above, the relative density of the compact is preferably 55% or higher and 75% or lower. By adjusting the relative density of the compact to be 55% or higher and 75% or lower, the thermal expansion coefficient of the heat dissipation member 1 can be easily designed to be 6 ppm/K or higher and 10 ppm/K or lower.

In order to adjust the relative density of the compact to be 55% or higher and 75% or lower, it is preferable to mix silicon carbide powders having different particle sizes. Examples of the silicon carbide include mixed powder including powder having an average particle size of 100 μm and powder having an average particle size of 10 μm or less and mixed powder including powder having an average particle size of 60 μm and powder having an average particle size of 10 μm or less.

Here, the average particle size can be obtained by calculating the average value of particle sizes of 1000 particles using a scanning electron microscope (for example, "JSM-T200 model", manufactured by JEOL Ltd.) and an image analyzer (for example, manufactured by Nippon Avionics Co., Ltd.).

In (2) the step of disposing inorganic fiber in the cut-out portion of the compact, it is preferable to disposing inorganic fiber in the cut-out portion of the compact, that is, in the metal portion 5 at the four corners. As a result, shrinkage cavities formed during impregnation with the metal can be suppressed. In addition, by adjusting the thermal expansion coefficient of the metal portion 5 to be close to that of the composite portion 2, stress generated by a heat cycle can be further reduced.

Examples of the inorganic fiber that can be used are as described above. Accordingly, the description will not be repeated.

In (3) the step of forming the composite portion 2 and the metal portion 5 by impregnating the compact and the inorganic fiber with metal, a so-called squeeze casting or die casting can be adopted in order to impregnate the compact with the metal.

In the case of squeeze casting, the compact is charged into a mold with a pouring gate having a product shape and is further set into a press concave mold. Next, molten metal is poured into the concave mold, is sealed with a convex mold, and is pressed. Further, the molten metal is cooled and solidified to form a block. After cooling, the compact (metal-silicon carbide composite) impregnated with the metal can be obtained.

By devising the shape of the mold with a pouring gate, a plurality of metal-silicon carbide composites can also be obtained at once.

The die casting is a method of obtaining a composite by setting the compact to a mold having a cavity with a product shape, clamping the mold, and pouring the metal at a high rate.

When the compact and the inorganic fiber are impregnated with the molten metal, it is preferable that the compact and the inorganic fiber are heated before the impregnation in any of the methods. The reason for this is to prevent the molten metal in the compact from being solidified in a state where the compact is insufficiently impregnated with the metal.

For example, when the compact and the inorganic fiber are impregnated with metal containing aluminum as a main component, it is preferable that the compact and the inorganic fiber are heated at 550° or higher although the temperature varies depending on the composition of the aluminum alloy to be used or the size, shape, and the like of the compact.

In addition, it is preferable that the temperature of the molten aluminum or the alloy thereof to be impregnated is typically 750° C. or higher. When the metal containing aluminum is 0.1 mass % or higher and 1.5 mass % or lower of magnesium and 0.1 mass % or higher and 18 mass % or lower of silicon, temperature conditions are more preferably 900° C. or lower.

In (4) the step of cutting the compact impregnated with the metal into a shape of the flat heat dissipation member 1, the composite portion 2, the hole 3, and the metal portion 5, and the like are cut out and formed in predetermined shapes.

More specifically, the compact impregnated with the metal is cooled to a room temperature and subsequently is cut using a wet bandsaw or the like. As a result, the heat dissipation member 1 having a desired form can be obtained.

The heat dissipation member 1 manufactured using the above-described manufacturing method includes the metal portion 5 as a part. The hole 3 can be provided in the metal portion 5.

Second Embodiment

FIG. 7 is a schematic diagram illustrating a heat dissipation member (heat dissipation member 1B) according to a second embodiment.

(a) of FIG. 7 is a top view of the heat dissipation member 1B where one main surface is a top surface, and (b) of FIG. 7 is a cross-sectional view taken along line B-B' of (a) of FIG. 7.

As illustrated in (a) of FIG. 7, the heat dissipation member 1 is a substantially rectangular flat plate. That is, the heat dissipation member 1 is substantially rectangular flat in a top view where one main surface is a top surface.

In the heat dissipation member 1B, a first metal portion 5A that includes at least a part of a peripheral portion thereof and a second metal portion 5B that is not in contact with the peripheral portion and the first metal portion 5A are present. In particular, in this point, the heat dissipation member 1B is different from the heat dissipation member 1 according to the first embodiment (in the heat dissipation member 1 according to the first embodiment, the entire metal portion 5 is "continuous").

Here, the second metal portion 5B is present preferably in a range of L/55 to L/5 more preferably in a range of L/50 to L/8 from a closest apex in the heat dissipation member 1B as illustrated in FIG. 8 (L represents the length of a diagonal line of the heat dissipation member 1B).

In addition, a hole (hole 3) penetrates the second metal portion 5B. Typically, the hole 3 penetrates only the metal portion 5B and does not pass through the composite portion 2. In addition, typically, the hole 3 is provided to penetrate a gap between main surfaces of the heat dissipation member 1 and preferably to be substantially perpendicular to the main surface of the heat dissipation member 1.

In the second embodiment, the metal portion is divided into the first metal portion 5A and the second metal portion 5B, and the second metal portion 5B is appropriately distant from the apex of the heat dissipation member 1B. As a result, the second embodiment has technical significance (additional technical significance different from that of the first embodiment) in that, for example, the proportion of the metal portion to the total volume of the heat dissipation member 1B can be designed to be relatively low and the toughness of the vicinity of the hole 3 can be made to be still sufficient.

In the second embodiment, basically, the following points can be made to be the same as those of the first embodiment. Accordingly, the description will not be repeated.

A point (in (a) and (b) of FIG. 7, the first metal portion 5A) that the metal portion may be continuously provided in the peripheral portion of the heat dissipation member 1B.

A point that a portion of the heat dissipation member 1B other than the metal portion ((a) and (b) of FIG. 7, the first metal portion 5A and the second metal portion 5B) is typically formed of the composite portion 2 (composite portion 2) where silicon carbides having voids are impregnated with metal.

A point that the proportion of the volume of the metal portion (the first metal portion 5A and the second metal portion 5B) to the total volume of the heat dissipation member 1B is 2.9% or higher and 12% or lower.

A point that 40% or higher of the total volume of the metal portion (the first metal portion 5A and the second metal portion 5B) is present in the region D within a distance of L/6 from an apex of any one of four corners of the heat dissipation member 1B.

Basically, features that are not clearly described above, a method of manufacturing the heat dissipation member 1B, and the like can be made to be the same as those of the first embodiment.

Third Embodiment

FIG. 9 is a schematic diagram illustrating a heat dissipation member (heat dissipation member 1C) according to a third embodiment.

(a) of FIG. 9 is a top view of the heat dissipation member 1C where one main surface is a top surface, and (b) of FIG. 9 is a cross-sectional view taken along line C-C' of (a) of FIG. 9.

As illustrated in (a) of FIG. 9, the heat dissipation member 1C is a substantially rectangular flat plate. That is, the heat dissipation member 1C is substantially rectangular flat in a top view where one main surface is a top surface.

A surface metal layer 4 is present on a main surface of the heat dissipation member 1C. In particular, in this point, the heat dissipation member 1C is different from the heat dissipation member 1 according to the first embodiment and the heat dissipation member 1B according to the second embodiment.

Typically, the surface metal layer 4 can be formed of the same metal as the metal forming the metal portion 5. That is, in FIG. 9, the surface metal layer 4 and the metal portion 5 are hatched in different ways. However, when the surface metal layer 4 and the metal portion 5 are formed of the same metal, typically, there is no "boundary" between the surface metal layer 4 and the metal portion 5.

Supplementarily, when the surface metal layer 4 is present in the heat dissipation member 1C as in the third embodiment, the volume of the surface metal layer 4 includes the volume of the metal portion 5.

That is, in the third embodiment, the total volume of the surface metal layer 4 and the metal portion 5 with respect to the total volume of the heat dissipation member 1C is 2.9% or higher and 12% or lower. In addition, 40% or higher of the total volume of the surface metal layer 4 and the metal portion 5 is present in the region D within a distance of L/6 from an apex of any one of four corners of the heat dissipation member 1C.

The reason why the volume of the surface metal layer 4 is included in the volume of the metal portion 5 is that there is no "boundary" between the surface metal layer 4 and the metal portion 5 as described above.

In (b) of FIG. 9, the total thickness of the upper and lower surface metal layers 4 is, for example, about 100 μm or more and 300 μm or less.

In addition, a plating layer may be present on the surface of the surface metal layer 4 (not illustrated in FIGS. 9A and 9B). The plating layer is, for example, a Ni plating. The thickness of each of the upper and lower plating layers is about 10 μm, and the total thickness of the upper and lower plating layers is about 20 μm.

In the third embodiment, basically, the following points can be made to be the same as those of the first embodiment or the second embodiment. Accordingly, the description will not be repeated.

A point that the metal portion 5 may be continuously provided in a peripheral portion of the heat dissipation member 1C.

A point that a portion of the heat dissipation member 1C other than the metal portion 5 (a portion other than the surface metal layer 4) are configured with a composite portion 2 where silicon carbide having voids is impregnated with metal (composite portion 2).

In addition, basically, features that are not clearly described above, a method of manufacturing the heat dissipation member 1C, and the like can be made to be the same as those of the first embodiment or the like.

Regarding the manufacturing method, one point will be supplementarily described. The surface metal layer 4 can be formed by devising (3) the step of forming the composite portion 2 and the metal portion 5 by impregnating the compact and the inorganic fiber with metal in the method of manufacturing the heat dissipation member 1 according to the first embodiment. For example, the surface metal layer 4 can be formed by devising the form of the concave mold and/or the convex mold, more specifically, by providing "gap" corresponding to the surface metal layer 4 between the mold and the compact in the step (3).

Fourth Embodiment

FIG. 10 is schematic diagram illustrating a heat dissipation member (heat dissipation member 1D) according to a fourth embodiment. FIG. 10 is a top view illustrating the heat dissipation member 1D where one main surface is a top surface.

The heat dissipation member 1D includes two holes 3 in the metal portion 5 at each of four corners, that is, eight holes 3 in total (through holes provided in a thickness direction of the heat dissipation member 1D). By providing the eight holes 3 in total, the heat dissipation member 1D can be more strongly fixed to another component with screws or the like. In addition, a force applied to each of the screws is further dispersed as compared to when the heat dissipation member is fixed to another component with four screws. Therefore, cracking or fracturing in the vicinity of the hole 3 can be further reduced.

In the fourth embodiment, basically, the following points can be made to be the same as those of the first embodiment, the second embodiment, or the third embodiment. Accordingly, the description will not be repeated.

A point that the metal portion 5 may be continuously provided in a peripheral portion of the heat dissipation member 1D.

A point that a portion of the heat dissipation member 1D other than the metal portion 5 (a portion other than the surface metal layer 4) are configured with a composite portion 2 where silicon carbide having voids is impregnated with metal (composite portion 2).

A point that the proportion of the volume of the metal portions 5 to the total volume of the heat dissipation member 1D is 2.9% or higher and 12% or lower.

In addition, 40% or higher of the total volume of the metal portion 5 is present in the region D within a distance of L/6 from an apex of any one of four corners of the heat dissipation member 1D.

Basically, features that are not clearly described above, a method of manufacturing the heat dissipation member 1D, and the like can be made to be the same as those of the first embodiment or the like.

Hereinabove, the embodiment of the present invention has been described. However, the embodiment is merely an example of the present invention, and various configurations other than the above-described configurations can be adopted. In addition, the present invention is not limited to the above-described embodiments, and modifications, improvements, and the like within a range where the object of the present invention can be achieved are included in the present invention.

EXAMPLES

The embodiments of the present invention will be described in more detail based on Examples and Comparative Examples. The present invention is not limited to Examples.

(Preparation of Heat Dissipation Member)

Commercially available high-purity silicon carbide powder A (average particle size: 200 μm), silicon carbide powder B (average particle size: 20 μm), and silica sol (SNOWTEX, manufactured by Nissan Chemical Operation) were prepared at a mass ratio of 70:40:5 and were mixed with each other using a stirring mixer for 1 hour to obtain mixed powder.

A pressure of 10 MPa was applied to the mixed powder and was formed into a flat shape having a size of 160 mm×120 mm×7 mm including a cut-out portion having a size shown in the following table at four corners. This compact was dried at a temperature of 100° C. for 2 hours and was heated in air at 900° C. for 2 hours to prepare a silicon carbide compact. Aluminum short fiber (mullite ceramic fiber, "ARSENE (registered trade name)", manufactured by Denka Corporation) was charged into the cut-out portion in an amount shown in the following table.

The obtained silicon carbide compact was processed into a shape of 20 mmϕ×7 mm, and the relative density was obtained from the dimension and the mass thereof. The relative density was 65%.

Next, the obtained silicon carbide compact was processed in a thickness of 4.8 mm using a diamond processing jig, each of 10 samples was interposed between SUS plates to which a release agent was applied, and an iron sheet having a thickness of 12 mm was further fixed using bolts and nuts having a diameter of 10 mmϕ such that one block was formed.

One block including the above-described four blocks was preheated to a temperature of 650° C. using an electric furnace, and was placed in a preheated press mold having a void with an inner dimension of 320 mm×260 mm×440 mm.

Molten aluminum alloy (containing 12 mass % of silicon and 0.5 mass % of magnesium) heated to a temperature of 800° C. was cast into a press mold, and was pressed at a pressure of 60 MPa for 20 minutes or longer to impregnate the silicon carbide compact with the aluminum metal.

A metal block including the composite obtained through the above-described steps was cooled to a room temperature and subsequently was cut using a wet bandsaw. As a result, a flat plate-shaped metal-silicon carbide composite having a size of 170 mm×130 mm×5 mm was extracted, the composite including a composite portion that was formed of the aluminum alloy and the silicon carbide and a metal portion that was formed of the aluminum alloy.

The outer periphery of the obtained metal-silicon carbide composite was mechanically processed into 162 mm×122 mm (that is, was mechanically processed such that +1 mm of the metal was formed in the peripheral portion as compared to the size of the silicon carbide compact before the impregnation). Next, the four corners were mechanically processed to form holes (through holes) having a diameter of 7.0 mm therein. As a result, a plate-shaped heat dissipation member shown in FIG. 1 was prepared. The more details are as follows.

(i) In Examples 1 to 12 and 15 to 18 and Comparative Examples 1 and 2, the positions of the holes were determined such that the center of the cut-out portion in the silicon carbide compact before the impregnation with the metal and the center of the hole (through hole) matched each other. For example, in Example 1, the holes having a diameter of 7.0 mm were provided at the centers of 17 mm×17 mm square regions corresponding to the positions where the cut-out portion was provided.

(ii) In Example 13, in consideration of the size of the cut-out portion in the silicon carbide compact before the impregnation with the metal, the holes having a diameter of 7.0 mm were provided at the centers of 8 mm×8 mm square regions corresponding to the positions where the cut-out portion was provided, the square region including a 7 mm×7 mm metal portion and a +1 mm metal portion of the peripheral portion.

(iii) In Example 14, as in Example 13, the holes having a diameter of 7.0 mm were provided at the centers of 7.5 mm×7.5 mm square regions corresponding to the positions where the cut-out portion was provided, the square region including a 6.5 mm×6.5 mm metal portion and a +1 mm metal portion of the peripheral portion.

That is, in each of Examples and Comparative Examples, the through hole was formed in the portion where the metal portion was formed.

Regarding the obtained heat dissipation member, the respective dimensions illustrated in FIG. 11 were measured using an industrial microscope. In addition, the thickness of the metal portion was measured using a micrometer, the volume of the metal portion was calculated and the volume proportion of the metal layer with respect to the total volume of the heat dissipation member was calculated. In addition, various numerical values were obtained based on these values, the size of the cut-out portion provided in advance, and the like.

(Performance Evaluation) Each of the heat dissipation members according to Examples and Comparative Examples was screwed and fixed with bolts and nuts to an aluminum plate having a size of 170 mm×130 mm×10 mm where a hole having a diameter of 7.0 mm was provided at each of four corners. At this time, the fastening torque was adjusted to 15 N·m using a torque wrench.

Next, each of the heat dissipation members attached to the aluminum plate underwent a heat cycle of −40° C. for 30 minutes and 150° for 30 minutes 300 times. Next, the fixing of the heat dissipation member to the aluminum plate was released.

By measuring the vicinity of the fastening portions (holes) of the four corners and the vicinity of an interface between the composite portion and the metal portion using an ultrasonic flaw detector (FS-Line, manufactured by Hitachi Construction Machinery Co., Ltd.), whether or not defects occurred was investigated. In addition, whether or not cracking and fracturing occurred from the surface side was determined using a 10-fold loupe.

Table 1 collectively show characteristics of the heat dissipation members and the silicon carbide compacts before the impregnation with the metal.

In addition, Table 2 collectively shows the evaluation results.

TABLE 2

Result of Ultrasonic Flaw Detection after Heat Cycle

| No. | Vicinity of Fastening Portion | Composite Portion and Interface between Composite Portion and Metal Layer |
|---|---|---|
| Example 1 | No Cracking or Fracturing | No Cracking or Fracturing |
| Example 2 | No Cracking or Fracturing | No Cracking or Fracturing |
| Example 3 | No Cracking or Fracturing | No Cracking or Fracturing |
| Example 4 | No Cracking or Fracturing | No Cracking or Fracturing |
| Example 5 | No Cracking or Fracturing | No Cracking or Fracturing |
| Example 6 | No Cracking or Fracturing | No Cracking or Fracturing |
| Example 7 | No Cracking or Fracturing | No Cracking or Fracturing |
| Example 8 | No Cracking or Fracturing | No Cracking or Fracturing |
| Example 9 | No Cracking or Fracturing | No Cracking or Fracturing |
| Example 10 | No Cracking or Fracturing | No Cracking or Fracturing |
| Example 11 | No Cracking or Fracturing | No Cracking or Fracturing |
| Example 12 | No Cracking or Fracturing | No Cracking or Fracturing |
| Example 13 | No Cracking or Fracturing | No Cracking or Fracturing |
| Example 14 | No Cracking or Fracturing | No Cracking or Fracturing |
| Example 15 | No Cracking or Fracturing | No Cracking or Fracturing |
| Example 16 | No Cracking or Fracturing | No Cracking or Fracturing |
| Example 17 | No Cracking or Fracturing | No Cracking or Fracturing |
| Example 18 | No Cracking or Fracturing | No Cracking or Fracturing |

TABLE 1

| | Silicon Carbide Compact | | | | Heat Dissipation Member | | | | | |
|---|---|---|---|---|---|---|---|---|---|---|
| | Cut-Out Shape | | Content of Aluminum Short Fiber in Cut-Out Portion (vol %) | Volume of Metal Cut-Out Portion (cm³) | Volume Proportion of Metal Portion to Total Volume of Heat Dissipation Member (%) | Volume Proportion of Metal Portion Present in Region D to Total Volume of Metal Portion (%) | $V_{hole}/(V_{metal}+V_{hole})$ | Presence of Composite Portion within 4.55 mm (1.3r) from Center of Hole | Distance from Apex of Rectangle to Outer Periphery of Hole (mm) | Presence of Hole within 5.07 mm (L/40) from Apex of Rectangle |
| No. | Length (mm) | Width (mm) | | | | | | | | |
| Example 1 | 17 | 17 | 5 | 7.8 | 7.9 | 81 | 0.11 | Not Present | 9.9 | Not Present |
| Example 2 | 15.8 | 15.8 | 5 | 7.0 | 7.1 | 79 | 0.12 | Not Present | 9.1 | Not Present |
| Example 3 | 15.8 | 15.8 | 10 | 7.0 | 7.1 | 79 | 0.12 | Not Present | 9.1 | Not Present |
| Example 4 | 15.8 | 15.8 | 15 | 7.0 | 7.1 | 79 | 0.12 | Not Present | 9.1 | Not Present |
| Example 5 | 15.8 | 15.8 | 20 | 7.0 | 7.1 | 79 | 0.12 | Not Present | 9.1 | Not Present |
| Example 6 | 15.8 | 15.8 | 30 | 7.0 | 7.1 | 79 | 0.12 | Not Present | 9.1 | Not Present |
| Example 7 | 12 | 12 | 5 | 4.9 | 5.0 | 70 | 0.18 | Not Present | 6.4 | Not Present |
| Example 8 | 12 | 12 | 10 | 4.9 | 5.0 | 70 | 0.18 | Not Present | 6.4 | Not Present |
| Example 9 | 12 | 12 | 15 | 4.9 | 5.0 | 70 | 0.18 | Not Present | 6.4 | Not Present |
| Example 10 | 12 | 12 | 20 | 4.9 | 5.0 | 70 | 0.18 | Not Present | 6.4 | Not Present |
| Example 11 | 12 | 12 | 30 | 4.9 | 5.0 | 70 | 0.18 | Not Present | 6.4 | Not Present |
| Example 12 | 7.5 | 7.5 | 10 | 3.2 | 3.2 | 53 | 0.31 | Present | 3.2 | Present |
| Example 13 | 7 | 7 | 10 | 3.0 | 3.1 | 51 | 0.33 | Present | 2.2 | Present |
| Example 14 | 6.5 | 6.5 | 10 | 2.9 | 2.9 | 49 | 0.35 | Present | 1.8 | Present |
| Example 15 | 22.2 | 22.2 | 5 | 11.9 | 12.0 | 88 | 0.07 | Not Present | 13.6 | Not Present |
| Example 16 | 21.9 | 21.9 | 5 | 11.6 | 11.8 | 87 | 0.07 | Not Present | 13.4 | Not Present |
| Example 17 | 21.6 | 21.6 | 5 | 11.4 | 11.5 | 87 | 0.07 | Not Present | 13.2 | Not Present |
| Example 18 | 19.8 | 19.8 | 5 | 9.9 | 10.0 | 85 | 0.08 | Not Present | 11.9 | Not Present |
| Comparative Example 1 | 23 | 23 | 10 | 12.6 | 12.8 | 88 | 0.06 | Present | 14.2 | Not Present |
| Comparative Example 2 | 23 | 23 | 40 | 12.6 | 12.8 | 88 | 0.06 | Present | 14.2 | Not Present |

TABLE 2-continued

Result of Ultrasonic Flaw Detection after Heat Cycle

| No. | Vicinity of Fastening Portion | Composite Portion and Interface between Composite Portion and Metal Layer |
|---|---|---|
| Comparative Example 1 | No Cracking or Fracturing | Cracking or Fracturing Occurred |
| Comparative Example 2 | No Cracking or Fracturing | Cracking or Fracturing Occurred |

In the evaluations of Examples 1 to 18, cracking, fracturing, or the like was not observed in the vicinity of the fastening portion or at the interface between the composite portion and the metal portion or the like after the heat cycles. That is, the results showed that, even in the very harsh evaluation where the heat cycle of −40° C. for 30 minutes and 150° for 30 minutes was performed 300 times, abnormality was not observed, and the recent harsh reliability requirements for the heat dissipation member can be satisfied.

In the heat dissipation members according to Examples 1 to 18, the toughness in the vicinity of the through hole for fixing to another component is improved, the proportion of the metal layer where the through hole is formed to the total volume of the composite is sufficiently lower, the occurrence of thermal stress during the heat cycle is suppressed, and damages such as cracking or fracturing are suppressed during fixing to another component or during actual use after fixing.

On the other hand, in Comparative Examples 1 and 2, the proportion of the metal portion to the total volume of the heat dissipation member was higher than 12 vol %, and cracking or fracturing occurred in the composite portion and at the interface between the composite portion and the metal portion after the heat cycle.

Examples 19 and 20: Examples of Use of Magnesium

The silicon carbide compact block (10 silicon carbide compacts were fixed with bolts and nuts) where the cut-out portion was provided was prepared using the same method as that of Examples 1 and 2, and was preheated to a temperature of 600° C. using an electric furnace. This block was placed in a preheated press mold having a void with an inner dimension of 320 mm×260 mm×440 mm.

Next, heat dissipation members were manufactured by performing the impregnation with the metal, the hole formation, and the like using the same method as that of Examples 1 and 2, except that pure molten magnesium heated to a temperature of 800° C. was cast into a press mold, and was pressed at a pressure of 60 MPa for 20 minutes or longer to impregnate the silicon carbide compact and the aluminum short fiber with magnesium. The same evaluations as described above were performed.

Even in Examples 19 and 20, cracking, fracturing, or the like was not observed in the vicinity of the fastening portion, in the composite portion, or at the interface between the composite portion and the metal layer. That is, the results showed that, even when magnesium was used as the metal instead of aluminum, the recent harsh reliability requirements for the heat dissipation member can be satisfied.

The present application claims priority based on Japanese Patent Application No. 2018-223830 filed on Nov. 29, 2018, the entire content of which is incorporated herein by reference.

The invention claimed is:

1. A heat dissipation member that is substantially rectangular flat, the heat dissipation member comprising:
   a composite portion where silicon carbide having voids is impregnated with metal; and
   a metal portion that is different from the composite portion,
   a proportion of a volume of the metal portion to a total volume of the heat dissipation member is 2.9% or higher and 12% or lower,
   when a length of a diagonal line of the heat dissipation member is represented by L, in a top view where one main surface of the heat dissipation member is a top surface, 40% or higher of a total volume of the metal portion is present in a region D within a distance of L/6 from an apex of any one of four corners of the heat dissipation member, and
   a hole that penetrates the metal portion in the region D is provided.

2. The heat dissipation member according to claim 1, wherein a thickness of the metal portion present in the region D is substantially the same as a thickness of the composite portion.

3. The heat dissipation member according to claim 1, wherein when the volume of the metal portion present in the region D is represented by $V_{metal}$ and a volume of the hole is represented by $V_{hole}$, a value of $V_{hole}/(V_{metal}+V_{hole})$ is 0.60 or lower.

4. The heat dissipation member according to claim 1, wherein when a radius of the hole is represented by r in the top view of the heat dissipation member where one main surface of the heat dissipation member is a top surface, the composite portion is not present in a region within a distance of 1.3 r from a center of the hole.

5. The heat dissipation member according to claim 1, wherein in the top view of the heat dissipation member where one main surface of the heat dissipation member is a top surface, the hole is not present in a region within a distance of L/40 from apexes of the four corners of the heat dissipation member.

6. The heat dissipation member according to claim 1, wherein a part of the metal portion is continuously provided in a peripheral portion of the heat dissipation member.

7. The heat dissipation member according to claim 1, wherein in the top view of the heat dissipation member where one main surface of the heat dissipation member is a top surface,
   the metal portion includes a first metal portion that includes at least a part of a peripheral portion of the heat dissipation member and a second metal portion that is not in contact with the peripheral portion of the heat dissipation member and the first metal portion,
   the second metal portion is present at a distance of L/55 to L/5 from a closest apex in the heat dissipation member, and
   the hole penetrates the second metal portion.

8. The heat dissipation member according to claim 1, wherein the metal portion includes an inorganic fiber containing alumina or silica as a main component.

9. The heat dissipation member according to claim 1, wherein a relative density of the silicon carbide is 55% or higher and 75% or lower.

10. The heat dissipation member according to claim 1, wherein the metal with which the composite portion is impregnated and metal contained in the metal portion are the same.

\* \* \* \* \*